United States Patent
Hsu

(10) Patent No.: US 9,013,863 B2
(45) Date of Patent: Apr. 21, 2015

(54) PROTECTIVE SHEATH

(71) Applicant: Fu-Yi Hsu, New Taipei (TW)

(72) Inventor: Fu-Yi Hsu, New Taipei (TW)

( * ) Notice: Subject to any disclaimer, the term of this patent is extended or adjusted under 35 U.S.C. 154(b) by 226 days.

(21) Appl. No.: 13/873,339

(22) Filed: Apr. 30, 2013

(65) Prior Publication Data

US 2014/0104761 A1  Apr. 17, 2014

(30) Foreign Application Priority Data

Oct. 11, 2012  (TW) .............................. 101219649 U

(51) Int. Cl.
  *H05K 5/00* (2006.01)
  *H05K 7/00* (2006.01)
  *B65D 85/00* (2006.01)
  *G06F 1/16* (2006.01)
  *H05K 7/14* (2006.01)

(52) U.S. Cl.
  CPC ............ *H05K 7/1401* (2013.01); *G06F 1/1632* (2013.01); *G06F 1/1654* (2013.01); *G06F 1/1669* (2013.01)

(58) Field of Classification Search
  CPC ........... G06F 1/16; H05K 7/14; H05K 7/1401
  See application file for complete search history.

(56) References Cited

U.S. PATENT DOCUMENTS

| | | | | |
|---|---|---|---|---|
| 6,256,192 B1 * | 7/2001 | Shannon | ................... | 361/679.06 |
| 6,829,140 B2 * | 12/2004 | Shimano et al. | ......... | 361/679.09 |
| 6,900,792 B2 * | 5/2005 | Sun et al. | ...................... | 345/156 |
| 7,280,348 B2 * | 10/2007 | Ghosh | ...................... | 361/679.27 |
| 7,281,698 B2 * | 10/2007 | Patterson, Jr. | ................. | 248/458 |
| 7,342,776 B1 * | 3/2008 | Chan | ......................... | 361/679.27 |
| 8,173,893 B2 * | 5/2012 | Huang | .......................... | 136/251 |
| 8,358,513 B2 * | 1/2013 | Kim | ................ | 361/807 |
| D684,978 S * | 6/2013 | Phillips et al. | ............... | D14/440 |
| 8,467,186 B2 * | 6/2013 | Zeliff et al. | .............. | 361/679.56 |
| D692,886 S * | 11/2013 | Bates et al. | ................... | D14/392 |
| 8,573,394 B2 * | 11/2013 | Ahee et al. | ..................... | 206/320 |
| D697,508 S * | 1/2014 | Hsu | ............... | D14/345 |
| 8,672,126 B2 * | 3/2014 | Rohrbach et al. | ............. | 206/320 |
| 8,720,843 B1 * | 5/2014 | Chen | ............................ | 248/455 |
| 8,746,449 B2 * | 6/2014 | Gallagher et al. | ............ | 206/320 |
| 8,749,960 B2 * | 6/2014 | Mori | ......................... | 361/679.03 |
| 8,763,795 B1 * | 7/2014 | Oten et al. | .................. | 206/45.23 |
| 8,824,136 B1 * | 9/2014 | Interian et al. | ........... | 361/679.41 |
| 8,837,131 B1 * | 9/2014 | Colby et al. | ............ | 361/679.06 |
| 8,875,879 B2 * | 11/2014 | Diebel et al. | .................. | 206/320 |
| 8,913,376 B2 * | 12/2014 | Wu et al. | .................. | 361/679.08 |
| 2004/0159762 A1 * | 8/2004 | Ghosh | .......................... | 248/351 |
| 2004/0160735 A1 * | 8/2004 | Ghosh et al. | .................. | 361/683 |
| 2005/0052831 A1 * | 3/2005 | Chen | ............................ | 361/680 |
| 2006/0007645 A1 * | 1/2006 | Chen et al. | .................... | 361/681 |

(Continued)

*Primary Examiner* — Hoa C Nguyen
*Assistant Examiner* — Xanthia C Cunningham

(57) ABSTRACT

A protective sheath comprises a rear plate, a front plate and a wireless HMI device comprising a main portion embedded inside the rear plate, a human-machine interface embedded inside the front plate and a soft flat cable electrically connecting there-between. The front plate comprises a first folding plate, a holding component for holding a portable electronic device on the first folding plate, a position limiting hinge, and a second folding plate pivoted to the first folding plate via the position limiting hinge. Hence, the first and the second folding plates can cover a rear surface of the portable electronic device together by being relatively unfolded, and are maintained at a presetting pivoting angle by the position limiting hinge after being relatively folded. The front plate can be folded relative to the first folding plate to cover a display surface of the portable electronic device.

20 Claims, 2 Drawing Sheets

(56) References Cited

U.S. PATENT DOCUMENTS

| | | | |
|---|---|---|---|
| 2006/0077622 A1* | 4/2006 | Keely et al. | 361/681 |
| 2006/0176661 A1* | 8/2006 | Allen | 361/683 |
| 2009/0056073 A1* | 3/2009 | Lin | 16/235 |
| 2010/0044259 A1* | 2/2010 | Wang | 206/320 |
| 2010/0172081 A1* | 7/2010 | Tian et al. | 361/679.29 |
| 2011/0002096 A1* | 1/2011 | Thorson | 361/679.04 |
| 2011/0199727 A1* | 8/2011 | Probst | 361/679.09 |
| 2011/0222238 A1* | 9/2011 | Staats et al. | 361/679.55 |
| 2011/0267757 A1* | 11/2011 | Probst et al. | 361/679.09 |
| 2012/0106078 A1* | 5/2012 | Probst et al. | 361/679.56 |
| 2013/0100011 A1* | 4/2013 | Lee et al. | 345/156 |
| 2013/0242490 A1* | 9/2013 | Ku | 361/679.3 |

* cited by examiner

PROTECTIVE SHEATH

CROSS-REFERENCE TO RELATED APPLICATIONS

This application claims priority from Taiwan Patent Application No. 101219649, filed 2012 Oct. 11, the contents of which are hereby incorporated by reference in their entirety for all purposes.

FIELD OF THE INVENTION

The present invention generally relates to a protective sheath, and more particularly to a protective sheath for a portable electronic device.

DESCRIPTION OF THE RELATED ART

With the development of technology, various portable electronic devices, such as a multimedia player (MP3, MP4 and so on), a cell phone, a personal digital assistant (PDA), a smart phone, a hand-held game console, an electronic book (E-book), a tablet personal computer (tablet PC), a netbook, a notebook and so on, have become an integral part of modern life to many people. To compare with the traditional desktop personal computer (desktop PC), a main advantage of the portable electronic device is easy to get carried. Therefore, in recent years, we can see people operating the portable electronic devices anytime and anywhere.

The above-mentioned portable electronic devices can be roughly categorized into two types: foldable portable electronic devices (such as a flip cell phone, a Nintendo Dual Screen (NDS), a netbook, a notebook and so on) and unfoldable portable electronic devices (such as a multimedia player (MP3, MP4 and so on), a bar cell phone, a slider cell phone, a swivel cell phone, a smart phone, a PDA, a E-book, a tablet PC and so on). Here, the foldable portable electronic devices are usually designed as two bodies respectively equipped with a keyboard and a screen, and the body equipped with the keyboard can cover and thus protect the screen equipped on the other body when the two bodies are relatively folded. In addition, the body equipped with the screen can further stand up with a support provided by the body equipped with the keyboard when the two bodies are relatively unfolded, so as to enable the portable electronic device to be put on a carrying surface (such as a table surface) for a user to watch or operate.

In contrast, the unfoldable portable electronic devices are often formed as an integral body, so that it is necessary to use an additional protective device, such as a screen protective film, a protective bag, a protective cover or a protective sheath, to protect the surface of the screen. Further, it is necessary to use an additional cradle or an additional support element to assist the unfoldable portable electronic devices in stably standing on the carrying surface as well.

A kind of commercially available protective sheath commonly used for the unfoldable portable electronic devices is foldable protective sheaths, which is capable of being used for not only protecting the surface of the screen of the unfoldable portable electronic devices by being folded, but also immediately enabling the unfoldable portable electronic devices to be operated by being unfolded. As a result, the foldable protective sheaths are quite convenient to use. Furthermore, most of the commercially available foldable protective sheaths can be used for assisting the unfoldable portable electronic devices in stably standing on the carrying surface as well. However, it is quite inconvenient to operate, especially to key messages in, the unfoldable portable electronic device standing on the carrying surface since it is generally designed without a keyboard.

SUMMARY OF THE INVENTION

The present invention is directed to a protective sheath, wherein the protective sheath is capable of protecting the display surface of the portable electronic device by using the front plate thereof, assisting the portable electronic device in stably standing on a carrying surface by using the rear plate thereof, and further inputting or expanding the display region by using the human-machine interaction (HMI) thereof.

The present invention provides a protective sheath suitable for a portable electronic device having a display surface and a rear surface opposite the display surface, wherein the protective sheath comprises a rear plate, a front plate and a wireless HMI device. The first folding plate has a first side edge and a second side edge opposite to each other. The first holding component is disposed to the first folding plate for holding the portable electronic device on the first folding plate from the rear surface. The position limiting hinge has at least a presetting pivoting angle. The second folding plate is pivoted to the first side edge via the position limiting hinge, wherein the first folding plate and the second folding plate are capable of being relatively unfolded for covering the rear surface together, and an included angle formed between the first folding plate and the second folding plate is capable of being maintained at the presetting pivoting angle by the position limiting hinge as the first folding plate and the second folding plate are relatively folded. The front plate is contiguous to the second side edge, and capable of being folded relative to the first folding plate for covering the display surface. The wireless HMI device comprises a soft flat cable, a main portion and a human-machine interface embedded inside the front plate and electrically connecting with the main portion via the soft flat cable, wherein an operation surface of the human-machine interface is exposed by an inner surface of the front plate.

According to an embodiment of the present invention, the first holding component is a silicon case, a leather case, a plastic case, at least an adhesive portion, at least a sucking portion, at least a fastening strap (for example a Velcro® strap), at least a magnet or at least an elastic tape disposed on an inner surface of the first folding plate, or at least a hook disposed on part of a peripheral of the first folding plate.

According to an embodiment of the present invention, the position limiting hinge is a hinge with a close fit structure or a hinge with a position limiting structure.

According to an embodiment of the present invention, the position limiting hinge is an embedded hinge.

According to an embodiment of the present invention, the position limiting hinge is an exposed hinge.

According to an embodiment of the present invention, the second holding plate has at least a sucking portion, at least a fastening strap, at least a magnet or at least an elastic tape disposed on an inner surface of the second folding plate, or a plurality of hooks disposed on part of a peripheral of the second folding plate, or a combination thereof, for keeping the second folding plate covering the rear surface.

According to an embodiment of the present invention, the rear surface has at least a glossy surface, while the rear plate further comprises at least a soft gel strip corresponding to the glossy surface in position and disposed on an inner surface of the second folding plate, and an attaching surface of the soft gel strip distant from the second folding plate is a uneven surface. At least part of air enclosed between the glossy surface and the attaching surface is capable of being exhausted by pressing the soft gel strip toward the glossy surface when the second folding plate covers the rear surface, so as to attach the attaching surface onto the glossy surface. In a specific embodiment, the soft gel strip can be made of at least one of epoxy resin, polyurethane (PU, commonly known as PU glue), thermoplastic polyurethane (TPU, commonly known as TPU glue), polysiloxanes (commonly known as silicone) and rubber.

According to an embodiment of the present invention, the wireless HMI device is in communication with the portable electronic device with at least one of Bluetooth, infrared rays (IR), radio, microwave and Wi-Fi network.

According to an embodiment of the present invention, the main portion comprises a printed circuit board assembly (PCBA) and a battery module, wherein the PCBA is embedded inside one of the first folding plate and the second folding plate, while the battery module is embedded inside the other one of the first folding plate and the second folding plate.

According to an embodiment of the present invention, the main portion comprises a PCBA and a battery module, and both of the PCBA and the battery module are embedded inside one of the first folding plate and the second folding plate.

According to an embodiment of the present invention, the front plate further has an opening exposing the operation surface.

According to an embodiment of the present invention, the wireless HMI device is a wireless keyboard, while the human-machine interface comprises a plurality of membrane switches and a plurality of key caps. The membrane switches are embedded inside the front plate. The key caps are correspondingly assembled on the membrane switches and each one of the key caps has a top surface, wherein the operation surface is formed from all of the top surfaces. In a specific embodiment, the key caps can be not to protrude out of the inner surface.

According to an embodiment of the present invention, the wireless HMI device is a wireless keyboard, the human-machine interface is composed of a plurality of membrane switches embedded inside the front plate, and the operation surface is formed from a plurality of pressing regions formed on the inner surface and corresponding to the membrane switches in position.

According to an embodiment of the present invention, the wireless HMI device is a wireless touchpad or a wireless touch screen, the human-machine interface is a touch panel embedded inside the front plate, and the operation surface is a touch surface of the touch panel.

According to an embodiment of the present invention, the wireless HMI device is a wireless expansion screen, the human-machine interface is a display panel embedded inside the front plate, and the operation surface is a display surface of the display panel.

According to an embodiment of the present invention, the protective sheath further comprises at least a sucking portion disposed on the inner surface, at least a fastening strap disposed on the inner surface, at least a magnet disposed on the inner surface, at least a hook disposed on part of a peripheral of the front plate, at least an elastic tape disposed on part of the peripheral or an outer surface of the front plate, or a combination thereof, for keeping the front plate covering the display surface.

According to an embodiment of the present invention, the display surface has at least a glossy surface, while the front plate further comprises at least a soft gel strip corresponding to the glossy surface in position and disposed on the inner surface, and an attaching surface of the soft gel strip distant from the inner surface is a uneven surface. At least part of air enclosed between the glossy surface and the attaching surface is capable of being exhausted by pressing the soft gel strip toward the glossy surface when the front plate covers the display surface, so as to attach the attaching surface onto the glossy surface. In a specific embodiment, the soft gel strip can be made of at least one of epoxy resin, polyurethane (PU, commonly known as PU glue), thermoplastic polyurethane (TPU, commonly known as TPU glue), polysiloxanes (commonly known as silicone) and rubber.

Accordingly, the protective sheath is capable of protecting the display surface of the portable electronic device by using the front plate thereof, assisting the portable electronic device in stably standing on a carrying surface by using the rear plate thereof, and further inputting or expanding the display region by using the HMI thereof.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations are not described in detail in order not to obscure the present invention.

Figure 1:
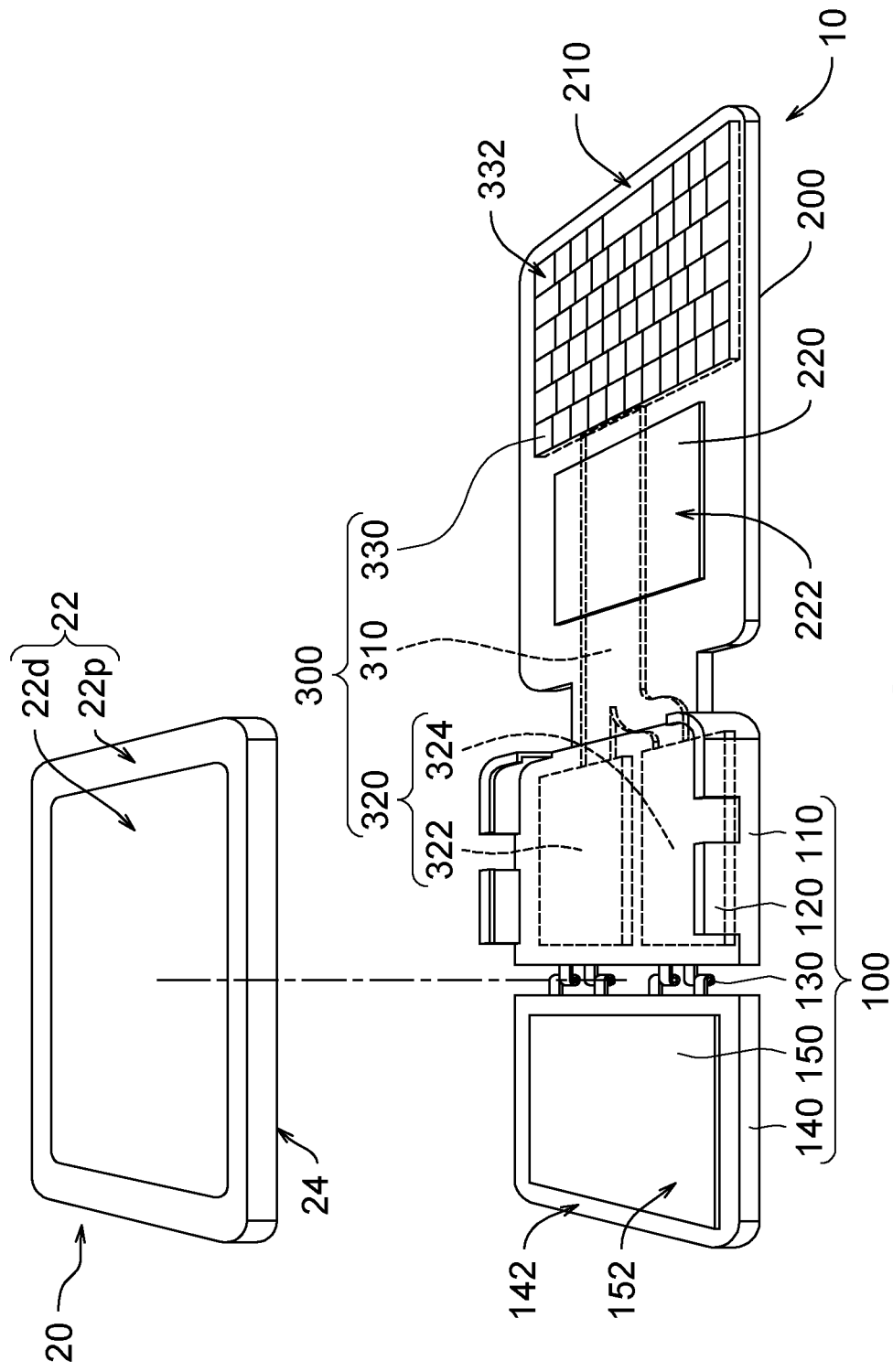
FIG. 1 illustrates a structural schematic perspective view of a protective sheath disassembled from a portable electronic device according to an embodiment of the present invention.
Figure 2:
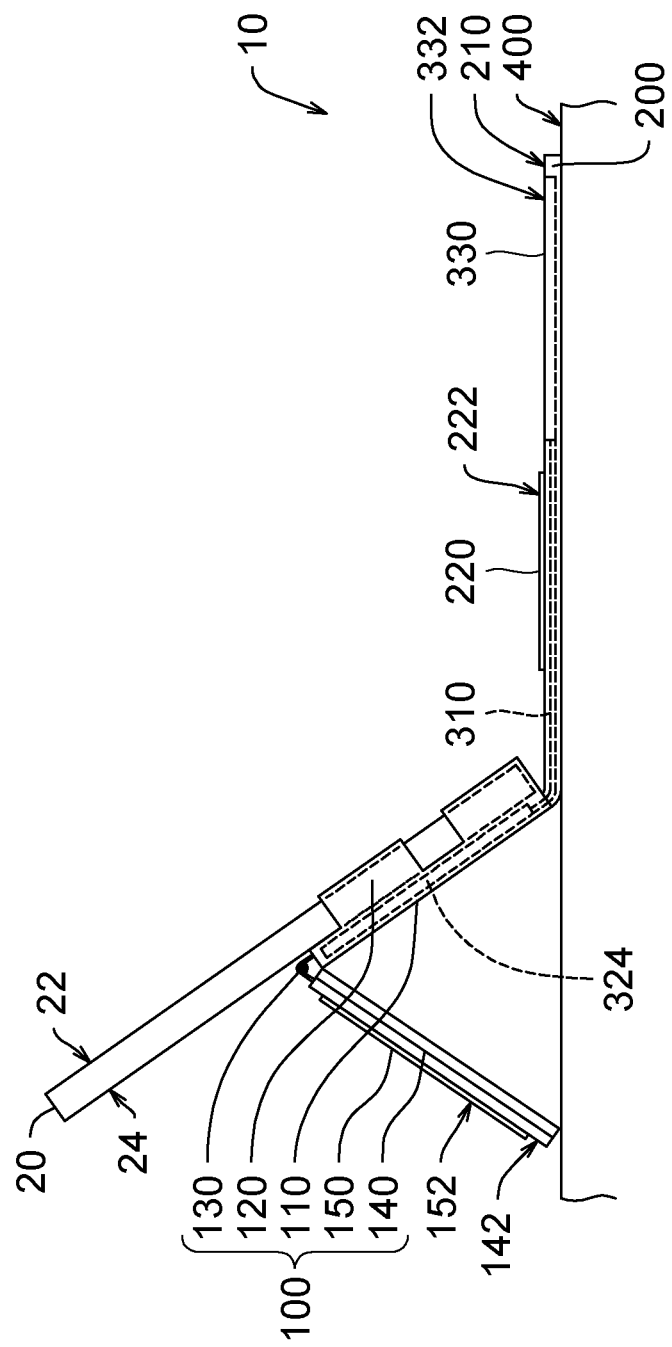
FIG. 2 illustrates a schematic front view of the protective sheath illustrated in FIG. 1 assisting the portable electronic device in standing.

FIG. 1 illustrates a structural schematic perspective view of a protective sheath disassembled from a portable electronic device according to an embodiment of the present invention, and FIG. 2 illustrates a schematic front view of the protective sheath illustrated in FIG. 1 assisting the portable electronic device in standing. In addition, all of the upper side, the lower side, the left side and the right side described in the present embodiment refer to the orientation of FIG. 2.

Referring to FIGS. 1 and 2 together, the protective sheath 10 of the present invention can be assembled on a portable electronic device 20 having a display surface 22 and a rear surface 24 opposite to the display surface 22. In addition, the display surface 22 can have a display region 22d and a periphery region 22p surrounding the display region 22d. In the present embodiment, the portable electronic device 20 is exemplarily illustrated as a tablet PC. However, in other non-illustrated embodiments, the portable electronic device can be various unfoldable portable electronic devices, such as a multimedia player (MP3, MP4 and so on), a bar cell phone, a slider cell phone, a swivel cell phone, a smart phone, a PDA, an E-book and so on.

The protective sheath 10 comprises a rear plate 100, a front plate 200 and a wireless HMI device 300. Herein, the rear plate 100 comprises a first folding plate 110, a holding component 120, a position limiting hinge 130 and a second folding plate 140. The holding component 120 is disposed to the first folding plate 110 and capable of holding the portable electronic device 20 on the first folding plate 110 from the rear surface 24. In addition, the second folding plate 140 is pivoted to a left side edge of the first folding plate 110 via the position limiting hinge 130. As a result, not only the first folding plate 110 and the second folding plate 140 can be relatively unfolded for covering the rear surface 24 together, but also an included angle formed between the first folding plate 110 and the second folding plate 140 can be maintained at a presetting pivoting angle by the position limiting hinge 130 as the first folding plate 110 and the second folding plate 140 are relatively folded.

In the present preferred embodiment, the holding component 120 is composed of, for example but not limited to, a plurality of hooks (exemplarily illustrating two symmetrical set of hooks in the figures) disposed on part of a peripheral of the first folding plate 110, while the position limiting hinge 130 is composed of, for example but not limited to, a plurality of exposed hinges with a close fit structure (exemplarily illustrating two exposed hinges in the figures). In another word, when the first folding plate 110 and the second folding plate 140 are relatively folded until the included angle formed there-between is equal to the presetting pivoting angle (for example equal to 30 degrees), a friction provided by the close fit structure of the position limiting hinge 130 restricts the relative rotation between the first folding plate 110 and the second folding plate 140, so as to maintain the included angle formed between the first folding plate 110 and the second folding plate 140.

However, in the other non-illustrated embodiments, the holding component can also be a silicon case, a leather case, a plastic case, at least an adhesive portion (for example but not limited to a double-sided adhesive), at least a sucking portion (for example but not limited to a sucker), at least a fastening strap (for example a Velcro® strap), at least a magnet or at least an elastic tape disposed on an inner surface of the first folding plate, or any other similar component capable of holding the portable electronic device on the first folding plate. In addition, the position limiting hinge can further be an exposed hinge with a position limiting structure (for example but not limited to at least a set of a latch and an aperture). In such a case, when the first folding plate and the second folding plate are relatively folded until the included angle formed there-between is equal to the presetting pivoting angle (for example equal to 30 degrees), the latch and the aperture are fastened together to restrict the relative rotation between the first folding plate and the second folding plate, so as to maintain the included angle formed between the first folding plate and the second folding plate. Further, in other non-illustrated embodiments, the position limiting hinge can further be an embedded hinge.

Moreover, the front plate 200 is contiguous to the right side edge and capable of being folded relative to the first folding plate 110 to cover the display surface 22. Therefore, after the front plate 200 at a position covering the display surface 22 is unfolded along a clockwise direction relative to the first folding plate 110 and the second folding plate 140 at a position covering the rear surface 24 is folded along a counterclockwise direction relative to the first folding plate 110 to the positions as illustrated in FIG. 2, the portable electronic device 20 can stably stand on a carrying surface 400 with a support provided by the position limiting hinge 130 and the second folding plate 140.

Besides, the wireless HMI device 300 comprises a soft flat cable 310, a main portion 320 embedded inside the rear plate 100 and a human-machine interface 330 electrically connecting with the main portion 320 via the soft flat cable 310. In the present preferred embodiment, the wireless HMI device 300 is, for example but not limited to, a wireless keyboard in communication with the portable electronic device 20 with wireless signals such as at least one of Bluetooth, infrared rays, radio, microwave and Wi-Fi network. Further, the main portion 320 is composed of, for example but not limited to, a PCBA 322 and a battery module 324 embedded inside the first folding plate 110 together. Herein, the PCBA 322 is composed of, for example but not limited to, a wireless signal emitting and/or receiving module for transmitting the above-mentioned wireless signals and a circuit board, while the battery module 324 is used for supplying electricity to the PCBA 322 for operation.

Also, the human-machine interface 330 is, for example but not limited to, embedded inside the front plate 200, and composed of a plurality of membrane switches commonly used in the commercially available thin keyboard. Furthermore, the operation surface 332 is, for example but not limited to, formed from a plurality of pressing regions, which are formed on the inner surface 210 by a thermal transfer printing technology or any other similar printing technology and corresponding to the membrane switches in position. Moreover, in the other non-illustrated embodiments, the human-machine interface can be composed of a plurality of membrane switches and a plurality of key caps corresponding to the membrane switches in position as well. In such a case, the membrane switches are also embedded inside the front plate, while the key caps are correspondingly assembled on the membrane switches, and the operation surface is formed from all of the top surfaces of the key caps. Furthermore, in a preferred embodiment, the key caps are preferably not to protrude out of the inner surface of the front plate, so as to prevent the key caps from directly contacting with (even scraping) the display surface of the portable electronic device.

Besides, in the other non-illustrated embodiments, the wireless HMI device can be a wireless touchpad or a wireless touch screen as well. In such a case, the human-machine interface is a touch panel embedded inside the front plate, and the operation surface is a touch surface of the touch panel. Alternatively, the wireless HMI device can further be a wireless expansion screen. In such a case, the human-machine interface is a display panel embedded inside the front plate, and the operation surface is a display surface of the display panel. In addition, in the other non-illustrated embodiments, the PCBA can be embedded inside the first folding plate, while the battery module can be embedded inside the second folding plate, and vice versa.

In a word, since the included angle formed between the first folding plate 110 and the second folding plate 140 can be maintained by the position limiting hinge 130, the position limiting hinge 130 can restrict the relative rotation between the first folding plate 110 and the second folding plate 140 after the first folding plate 110 and the second folding plate 140 are relatively unfolded to form coplanar (if a presetting pivoting angle equal to 180 degrees). In such a case, the first folding plate 110 can cover the rear surface 24 of the portable electronic device 20 together with the second folding plate 140. Moreover, the position limiting hinge 130 can restrict the relative rotation between the first folding plate 110 and the second folding plate 140 after the second folding plate 140 is folded along a counterclockwise direction relative to the first folding plate 110 until the included angle formed between the first folding plate 110 and the second folding plate 140 is equal to another presetting pivoting angle (for example equal to 30 degrees). In such a case, the user can further unfold the front plate 200 along a clockwise direction relative to the first folding plate 110, so as to utilize the wireless HMI device 300 of the protective sheath 10 for inputting on the carrying surface 400 or for expanding the display region 22d of the portable electronic device 20 in order to enhance the convenience for operation.

Furthermore, in the present preferred embodiment, the rear surface 24 of the portable electronic device 20 can be designed as not only a whole glossy surface but also a plurality of glossy surfaces. Alternatively, it is possible to form at least a glossy surface by attaching at least an additional applying skin on the rear surface 24 as well if the rear surface 24 of the portable electronic device 20 is a matte finished surface. In such of cases, the rear plate 100 can further comprise at least a soft gel strip 150 (exemplarily illustrating a soft gel strip in the figures) corresponding to the glossy surface on the rear surface 24 in position and disposed on the inner surface 142 of the second folding plate 140, and an attaching surface 152 of the soft gel strip 150 distant from the inner surface 142 is formed as a uneven surface. Hence, at least part of air enclosed between the glossy surface and the attaching surface 152 can be exhausted by pressing the soft gel strip 150 toward the glossy surface as the second folding plate 140 covers the rear surface 24, so as to utilize the vacuum adsorption formed between the attaching surface 152 and the glossy surface to attach the soft gel strip 150 onto the glossy surface.

In detail, the soft gel strip 150 illustrated in the present preferred embodiment is made of, for example but not limited to, at least one of epoxy resin, polyurethane (PU, commonly known as PU glue), thermoplastic polyurethane (TPU, commonly known as TPU glue), polysiloxanes (commonly known as silicone) rubber and any other material with fine texture and well elasticity. Furthermore, a peripheral region of the attaching surface 152 can be an even surface, while a central region of the attaching surface 152 can be slightly dented toward the inner surface 210, so as to form the attaching surface 152 as a uneven surface. Thus, an enclosed space will be formed between the glossy surface and the attaching surface 152 when the soft gel strip 150 contacts with the glossy surface on the rear surface 24. Besides, the air enclosed between the glossy surface and the attaching surface 152 can further be exhausted by pressing the soft gel strip 150 toward the glossy surface. It should be noted that the external air can neither pass through the soft gel strip 150 with the fine texture nor the glossy surface on the inner surface 210 after the user releases the soft gel strip 150. As a result, the soft gel strip 150 is attached on the glossy surface by the vacuum adsorption formed between the attaching surface and the glossy surface.

However, the present invention is not limited to the above mentioned embodiment. For example, in other preferred embodiments, the attaching surface can further be an uneven surface with a plurality of dents. Even further, in a micro view, a substantially even surface can further have a plurality of micro dents as well, i.e. the attaching surface can further be a substantially even surface with a plurality of micro dents as well.

Furthermore, in the other non-illustrated embodiments, the above-mentioned soft gel strip can further be replaced by at least a sucking portion, at least a fastening strap, at least a magnet or at least an elastic tape disposed on an inner surface of the second folding plate, or at least a hook disposed on part of a peripheral of the second folding plate, i.e. it is possible to keep the second folding plate covering the rear surface by other methods.

Also, the display surface 22 of the commercially available portable electronic device 20 is usually designed as a whole glossy surface. Therefore, the front plate 200 can further comprise at least a soft gel strip 220 (exemplarily illustrating a soft gel strip in the figures) corresponding to the glossy surface of the display surface 22 in position and disposed on the inner surface 210 of the front plate 200, and an attaching surface 222 of the soft gel strip 220 distant from the inner surface 210 is formed as a uneven surface. In another word, the front plate 200 can also be attached on the display surface 22 via the soft gel strip 220 as the soft gel strip 150 disclosed above does. Similarly, in the other non-illustrated embodiments, the above-mentioned soft gel strip can further be replaced by at least a sucking portion, at least a fastening strap or at least a magnet disposed on an inner surface of the front plate, or at least a hook disposed on part of a peripheral of the front plate, or at least an elastic tape disposed on part of the peripheral or an outer surface of the front plate, or a combination thereof, i.e. it is possible to keep the front plate covering the display surface by other methods.

In summary, the protective sheath in the present invention is capable of being used for not only protecting the display surface of the portable electronic device as the conventional protective sheath does, but also assisting the portable electronic device in stably standing on a carrying surface. Further, it is possible to utilize the wireless HMI device of the protective sheath for inputting or expanding the display region of the portable electronic device as well. It should be noted that the main portion, which is the thickest and heaviest part in the wireless HMI device because comprising the PCBA and the battery module, is embedded inside the rear plate, while the human-machine interface is embedded inside the front plate. Therefore, the front plate can be designed lighter and thinner.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A protective sheath, suitable for a portable electronic device having a display surface and a rear surface opposite the display surface, wherein the protective sheath comprises:
   a rear plate, comprising:
      a first folding plate, having a first side edge and a second side edge opposite to each other;
      a first holding component, disposed to the first folding plate for holding the portable electronic device on the first folding plate from the rear surface;
      a position limiting hinge, having at least a presetting pivoting angle; and
      a second folding plate, pivoted to the first side edge via the position limiting hinge, wherein the first folding plate and the second folding plate are capable of being relatively unfolded for covering the rear surface together, and an included angle formed between the first folding plate and the second folding plate is capable of being maintained at the presetting pivoting angle by the position limiting hinge as the first folding plate and the second folding plate are relatively folded;
   a front plate, contiguous to the second side edge, and capable of being folded relative to the first folding plate for covering the display surface; and a wireless HMI device, comprising:
  a soft flat cable;
  a main portion, embedded inside the rear plate; and
  a human-machine interface, embedded inside the front plate, and electrically connecting with the main portion via the soft flat cable, wherein an operation surface of the human-machine interface is exposed by an inner surface of the front plate.

2. The protective sheath as claimed in claim 1, wherein the first holding component is a silicon case, a leather case, a plastic case, at least an adhesive portion, at least a sucking portion, at least a fastening strap, at least a magnet or at least an elastic tape disposed on an inner surface of the first folding plate, or at least a hook disposed on part of a peripheral of the first folding plate.

3. The protective sheath as claimed in claim 1, wherein the position limiting hinge is a hinge with a close fit structure or a hinge with a position limiting structure.

4. The protective sheath as claimed in claim 1, wherein the position limiting hinge is an embedded hinge.

5. The protective sheath as claimed in claim 1, wherein the position limiting hinge is an exposed hinge.

6. The protective sheath as claimed in claim 1, wherein the second holding plate has at least a sucking portion, at least a fastening strap, at least a magnet or at least an elastic tape disposed on an inner surface of the second folding plate, or a plurality of hooks disposed on part of a peripheral of the second folding plate, or a combination thereof, for keeping the second folding plate covering the rear surface.

7. The protective sheath as claimed in claim 1, wherein the rear surface has at least a glossy surface, the rear plate further comprises at least a soft gel strip corresponding to the glossy surface in position and disposed on an inner surface of the second folding plate, an attaching surface of the soft gel strip distant from the second folding plate is a uneven surface, and at least part of air enclosed between the glossy surface and the attaching surface is capable of being exhausted by pressing the soft gel strip toward the glossy surface when the second folding plate covers the rear surface, so as to attach the attaching surface onto the glossy surface.

8. The protective sheath as claimed in claim 7, wherein the soft gel strip is made of at least one of epoxy resin, polyurethane (PU), thermoplastic polyurethane (TPU), polysiloxanes and rubber.

9. The protective sheath as claimed in claim 1, wherein the wireless HMI device is in communication with the portable electronic device with at least one of Bluetooth, infrared rays, radio, microwave and Wi-Fi network.

10. The protective sheath as claimed in claim 1, wherein the main portion comprises a printed circuit board assembly and a battery module, the printed circuit board assembly is embedded inside one of the first folding plate and the second folding plate, while the battery module is embedded inside the other one of the first folding plate and the second folding plate.

11. The protective sheath as claimed in claim 1, wherein the main portion comprises a printed circuit board assembly and a battery module, and both of the printed circuit board assembly and the battery module are embedded inside one of the first folding plate and the second folding plate.

12. The protective sheath as claimed in claim 1, wherein the front plate further has an opening exposing the operation surface.

13. The protective sheath as claimed in claim 1, wherein the wireless HMI device is a wireless keyboard, and the human-machine interface comprises:
  a plurality of membrane switches, embedded inside the front plate; and
  a plurality of key caps, correspondingly assembled on the membrane switches, wherein each one of the key caps has a top surface, and the operation surface is formed from all of the top surfaces.

14. The protective sheath as claimed in claim 13, wherein the key caps are not to protrude out of the inner surface.

15. The protective sheath as claimed in claim 1, wherein the wireless HMI device is a wireless keyboard, the human-machine interface is composed of a plurality of membrane switches embedded inside the front plate, and the operation surface is formed from a plurality of pressing regions formed on the inner surface and corresponding to the membrane switches in position.

16. The protective sheath as claimed in claim 1, wherein the wireless HMI device is a wireless touchpad or a wireless touch screen, the human-machine interface is a touch panel embedded inside the front plate, and the operation surface is a touch surface of the touch panel.

17. The protective sheath as claimed in claim 1, wherein the wireless HMI device is a wireless expansion screen, the human-machine interface is a display panel embedded inside the front plate, and the operation surface is a display surface of the display panel.

18. The protective sheath as claimed in claim 1, further comprising at least a sucking portion disposed on the inner surface, at least a fastening strap disposed on the inner surface, at least a magnet disposed on the inner surface, at least a hook disposed on part of a peripheral of the front plate, at least an elastic tape disposed on part of the peripheral or an outer surface of the front plate, or a combination thereof, for keeping the front plate covering the display surface.

19. The protective sheath as claimed in claim 1, wherein the display surface has at least a glossy surface, the front plate further comprises at least a soft gel strip corresponding to the glossy surface in position and disposed on the inner surface, an attaching surface of the soft gel strip distant from the inner surface is a uneven surface, and at least part of air enclosed between the glossy surface and the attaching surface is capable of being exhausted by pressing the soft gel strip toward the glossy surface when the front plate covers the display surface, so as to attach the attaching surface onto the glossy surface.

20. The protective sheath as claimed in claim 19, wherein the soft gel strip is made of at least one of epoxy resin, polyurethane (PU), thermoplastic polyurethane (TPU), polysiloxanes and rubber.

* * * * *